(12) United States Patent
Lee et al.

(10) Patent No.: US 9,690,188 B2
(45) Date of Patent: Jun. 27, 2017

(54) PHOTOMASK AND METHOD FOR MANUFACTURING PHOTOMASK

(71) Applicant: NATIONAL CHENG KUNG UNIVERSITY, Tainan (TW)

(72) Inventors: Yung-Chun Lee, Tainan (TW); Chun-Ying Wu, Taichung (TW); Heng Hsieh, Tainan (TW); Yi-Ta Hsieh, Hsinchu (TW); Jhih-Nan Yan, Pingtung County (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 192 days.

(21) Appl. No.: 14/753,580

(22) Filed: Jun. 29, 2015

(65) Prior Publication Data

US 2015/0378252 A1 Dec. 31, 2015

(30) Foreign Application Priority Data

Jun. 30, 2014 (TW) .............................. 103122469 A (51) Int. Cl.
*G03F 1/38* (2012.01)

(52) U.S. Cl.
CPC ...................................... *G03F 1/38* (2013.01)

(58) Field of Classification Search
CPC .......................................................... G03F 1/38
USPC ............................................................ 430/5
See application file for complete search history.

(56) References Cited

U.S. PATENT DOCUMENTS 9,465,296 B2 * 10/2016 Kobrin .................. G03F 7/2035
430/322

FOREIGN PATENT DOCUMENTS

| KR | 10-2009-0003601 A | 1/2009 |
| TW | 14753580 A | 1/2013 |

* cited by examiner

*Primary Examiner* — Christopher Young
(74) *Attorney, Agent, or Firm* — Muncy, Geissler, Olds & Lowe, P.C.

(57) ABSTRACT

A method for manufacturing a photomask is provided. The method includes providing a flexible substrate, forming a plurality of microstructures on the flexible substrate, coating the flexible substrate with a shading material to form a shading layer on the substrate, and solidifying the shading layer which is a single layer.

12 Claims, 8 Drawing Sheets

PHOTOMASK AND METHOD FOR MANUFACTURING PHOTOMASK

CROSS REFERENCE TO RELATED APPLICATIONS

This Non-provisional application claims priority under 35 U.S.C. §119(a) on Patent Application No(s). 103122469 filed in Taiwan, Republic of China on Jun. 30, 2014, the entire contents of which are hereby incorporated by reference.

BACKGROUND OF THE INVENTION

Field of Invention

The invention relates to a photomask and a method for manufacturing a photomask.

Related Art

In conventional photolithography, utilizing the photomask to proceed with the ultraviolet (UV) exposure on the photoresist layer is mainly classified into contact photolithography and reticle lithography.

In contact photolithography, the size ratio of the feature pattern on the surface of the photomask and the pattern actually replicated on the substrate is 1:1, and the photomask is directly very close to or nearly contacts the surface of the photoresist layer during the exposure. In reticle lithography, the size of the feature pattern on the surface of the photomask is several times of that of the pattern actually replicated on the substrate, and the exposure on the photoresist is carried out by the projection provided by an optical system.

In contact photolithography, the shading pattern on the surface of the photomask contacts and rubs against the photoresist layer on the substrate easily resulting in that the shading pattern is damaged and the lifespan of the photomask is shortened. In addition, when the surface of the substrate coated with the photoresist layer is not highly even, an uncertain gap and distance between the photomask and the photoresist layer occur and result in scattering and diffraction of light. Thus, the dimension error of the exposure is also caused and the lateral range of the exposure on the shallow portion of the photoresist layer is enlarged, so that the photoresist structure with high aspect ratio cannot be made.

Therefore, it is an important subject to provide a photomask and its manufacturing method of low cost, faster manufacturing process, relatively low operating temperature, easy manufacture, increased tightness between the photomask and the photoresist layer.

SUMMARY OF THE INVENTION

An objective of the invention is to provide a photomask and its manufacturing method of low cost, faster manufacturing process, relatively low operating temperature, easy manufacture, increased tightness between the photomask and the photoresist layer.

To achieve the above objective, a method for manufacturing a photomask includes providing a flexible substrate, forming a plurality of microstructures on the flexible substrate, coating the flexible substrate with a shading material to form a shading layer on the flexible substrate, and solidifying the shading layer which is a single layer.

In one embodiment, the material of the flexible substrate is polyurethane acrylate (PUA), polyvinyl alcohol (PVA), an ultraviolet curing resin, polydimethylsiloxane (PDMS), or combinations thereof In one embodiment, the material of the shading layer is a carbon black photoresist, a red photoresist, or a green photoresist.

In one embodiment, the shading layer and the microstructures directly form a patterned shading layer.

In one embodiment, after the shading layer is solidified, a part of the shading layer is removed to form a patterned shading layer.

In one embodiment, the removing step further includes providing a thermoplastic macromolecule sheet to attach to the shading layer, connecting the thermoplastic macromolecule sheet to the shading layer, and removing the thermoplastic macromolecule sheet so as to remove the part of the shading layer along with the thermoplastic macromolecule sheet.

In one embodiment, the thermoplastic macromolecule sheet is formed by polyethylene terephthalate (PET), rigid polyvinyl chloride (Rigid PVC), polyvinyl alcohol (PVA), polyamide (PA), or polylactic acid (PLA).

In one embodiment, the shading material is formed on the substrate by spin coating, spray coating, blade coating, or immersion coating.

A photomask is further provided. The photomask includes a flexible substrate and a shading layer. The flexible substrate has a plurality of microstructures on the surface thereof The shading layer is a single layer, the microstructures are filled with the shading layer, and the shading layer and the microstructures form a patterned shading layer.

In one embodiment, the material of the patterned shading layer is a carbon black photoresist, a red photoresist, or a green photoresist.

In one embodiment, the shading layer is disposed on the surface of the substrate between the microstructures simultaneously.

As mentioned above, a plurality of microstructures are formed on the flexible substrate and the shading material is formed on the substrate by coating. In such method, the cost is reduced, the manufacturing process is faster, the operating temperature is lower, and the manufacture becomes easier in comparison with the conventional method utilizing a metal layer as a shading material. Besides, because the shading material is a solution, the layer uniformity of the shading layer is improved. Moreover, utilizing the flexible substrate further results in that the tightness between the photomask and the semiconductor substrate becomes higher and the precision of exposure and development is improved.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements. In the following embodiments and drawings, the elements and the steps which do not directly relate to the invention are omitted. Moreover, the size ratio of various elements is only for easily understanding but not for limiting the actual proportion.

It is noted that the photomask and the method for manufacturing a photomask according to the invention may be applied to the photolithography processes of semiconductor or optoelectronic display, or it may be applied to the photolithography process during manufacturing a patterned sapphire substrate of a light-emitting diode, but they are not limited to the above applications. Moreover, the photomask according to the invention may be a contact three-dimensional photomask.

Figure 1:
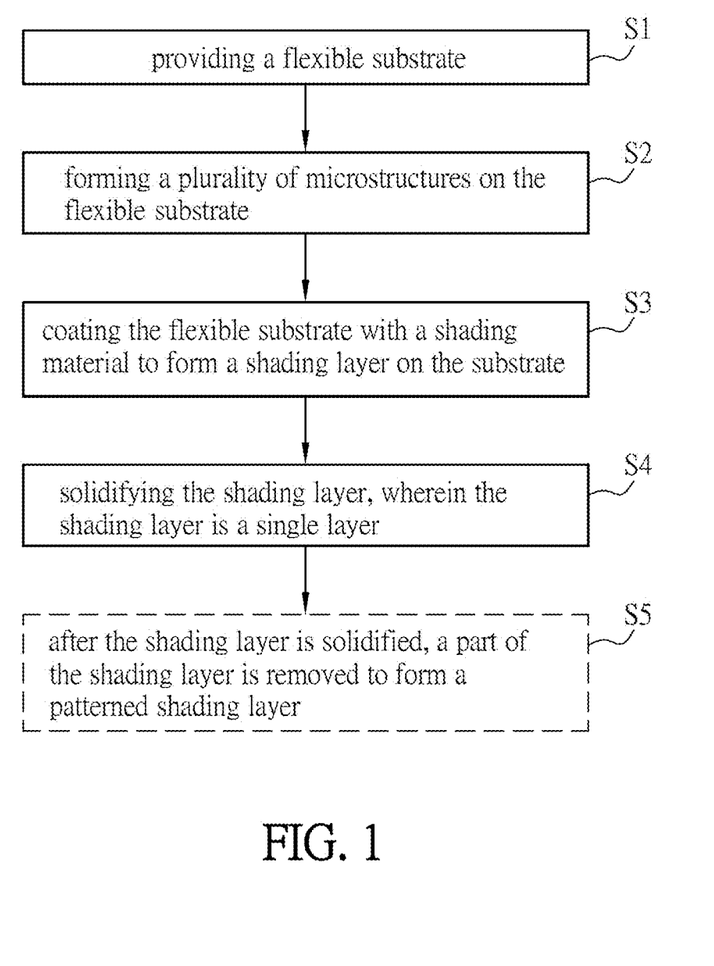
FIG. 1 is a flow chart of manufacturing a photomask according to the embodiment of the invention.
Figure 2A:
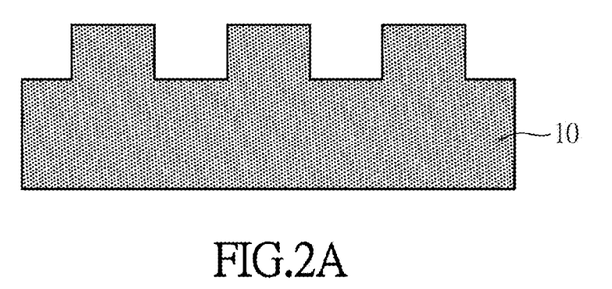
FIGS. 2A to 2F are schematic diagrams of manufacturing a photomask according to the embodiment of the invention.
Figure 2B:
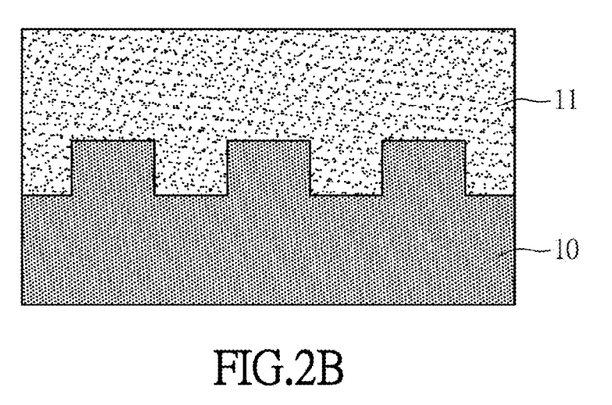
Figure 2C:
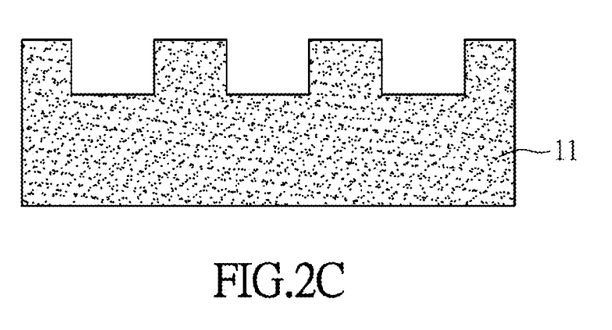
Figure 2D:
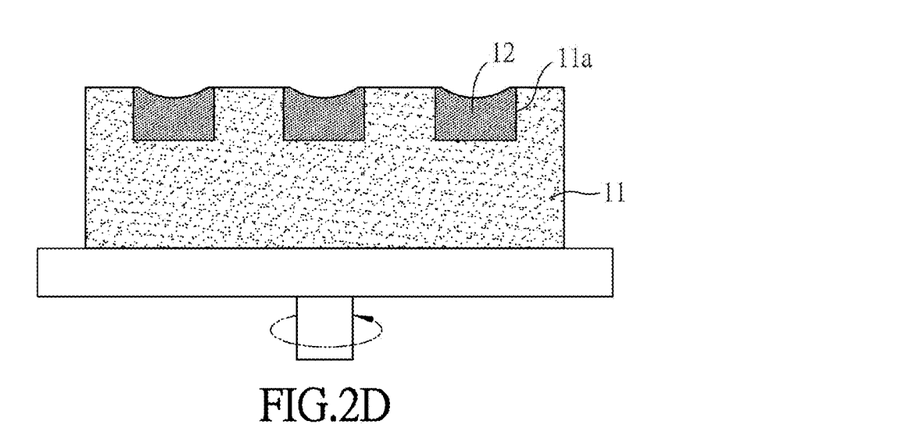
Figure 2E:
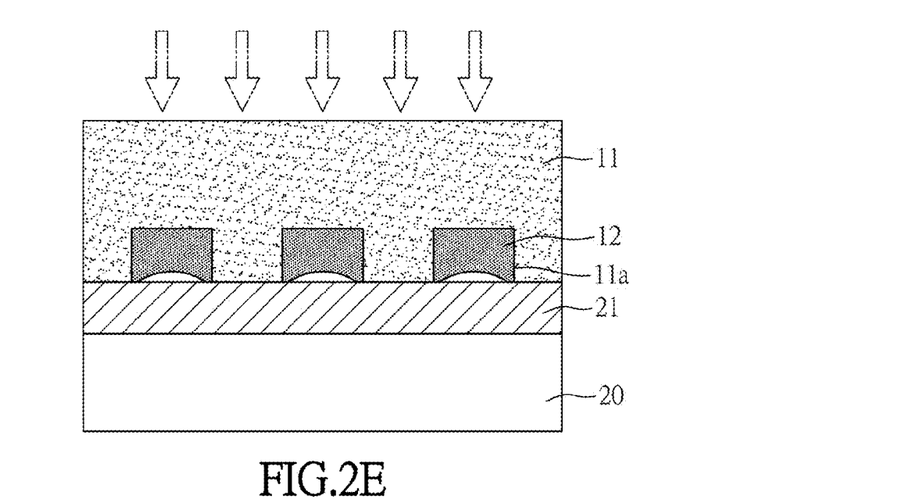
Figure 2F:
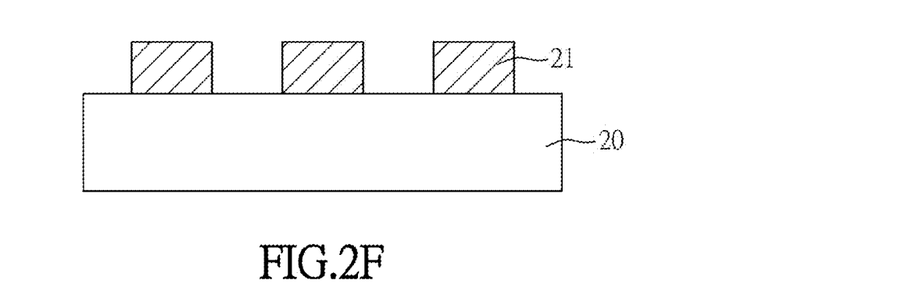

Referring to FIGS. 1 to 2F, FIG. 1 is a flow chart of manufacturing a photomask according to the embodiment of the invention, and FIGS. 2A to 2F are schematic diagrams of manufacturing a photomask according to the embodiment of the invention.

The photomask of the embodiment includes the flexible substrate 11 and the shading layer 12. The surface of the flexible substrate 11 has a plurality of microstructures 11a. In the embodiment, the microstructure 11a presents a concave configuration for example but is not limited thereto. The microstructures 11a is filled with the shading layer 12 which is a single layer, and the shading layer 12 and the microstructures 11a form a patterned shading layer. However, in other embodiments, the shading layer may be also disposed on the surface of the flexible substrate 11 between the microstructures 11a simultaneously. That is to say, depending on various designs, the shading layer is only disposed in the microstructures 11a, or the shading layer may be disposed in the microstructures 11a and on partial or total surface of the flexible substrate 11.

In the embodiment, "the shading layer" is a layer formed after the shading material is solidified in the manufacturing process. Moreover, "the patterned shading layer" is a shading layer actually disposed on the substrate after the photomask is accomplished. It should be noted that if the patterned appearance has been formed when coated with the shading layer, the shading layer of the embodiment is equivalent to the patterned shading layer. However, in the embodiment, if a shading layer is applied but further steps are necessary to form the designate appearance of the shading layer of the accomplished photomask, this shading layer is only an intermediate in the manufacturing process in the embodiment, and this shading layer and the patterned shading layer are different.

The process of manufacturing the photomask of the embodiment is described in detail below.

The steps of manufacturing the photomask of the embodiment at least include following steps. First, the flexible substrate 11 is provided (step S1).

The material of the flexible substrate 11 of the embodiment is polyurethane acrylate (PUA), polyvinyl alcohol (PVA), an ultraviolet curing resin, polydimethylsiloxane (PDMS), combinations thereof, or other flexible macromolecule materials having penetrability. Polydimethylsiloxane (PDMS) may be one of h-PDMS, s-PDMS, and UV-PDMS depending on various needs.

The advantage of utilizing the flexible substrate in the embodiment is that even though the unevenness of the surface of the wafer increases with the size of the wafer, compared with a photomask manufactured by the conventional rigid substrate, the photomask manufactured by the flexible substrate has preferable tightness with the surface of the wafer due to flexibility. Therefore, the error caused by the unevenness of the surface of the wafer can be reduced in the process of exposure and development, so that that the obtained wafer circuit also has preferable precision of the linewidth.

Then, a plurality of microstructures 11a are formed on the flexible substrate 11 (step S2). The microstructures 11a on the flexible substrate 11 may be replicated from the main mold 10 by casting the substrate 11, or they may be manufactured by mechanical processing or chemical etching on the surface of the sheet formed from a substrate. In the embodiment, the flexible substrate 11 is replicated from the main mold 10 by casting for example.

Referring to FIGS. 2A to 2C, firstly, a silicon wafer acts as the material of the main mold 10 in the embodiment, and a plurality of protruding cylindrical microstructures are formed on the surface of the silicon wafer by chemical dry etching to form the main mold 10. Then, the surface of the main mold is filled with the substrate (e.g. PDMS) by casting (FIG. 2B), and the substrate is solidified by heating to form the flexible substrate 11. Last, the completely solidified flexible substrate 11 peels off the main mold 10 to form a PDMS substrate which is pervious to light and has a concave hole-shaped structure on the surface thereof as shown in FIG. 2C. In one experimental example of the embodiment, the substrate is solidified to form the flexible substrate 11 by heating at the temperature of 40° C. to 100° C.

The flexible substrate 11 is coated with the shading material to form the shading layer 12 on the flexible substrate 11 (step S3). In the embodiment, spin coating is utilized. However, in other embodiments, the shading material may be disposed on the flexible substrate 11 by spray coating together with air knife scraping. Alternatively, the coating effect may be also achieved by blade coating or immersion coating.

The shading material is a solution that may be, for example, a carbon black photoresist, a red photoresist, a green photoresist, or any solution of the shading material that may shield a specific wavelength and be capable of spin coating. Moreover, a step of surface processing may also be added prior to step S3.

The shading layer 12 is solidified, and the shading layer 12 is a single layer (step S4). The shading layer 12 is formed on the flexible substrate 11 for shading. In the embodiment, the aspects of the shading layer 12 are not particularly limited. Moreover, the shading layer 12 may be formed by a carbon black photoresist, a red photoresist, or a green photoresist depending on various shading materials.

As shown in FIG. 2D, when the microstructures 11a are coated with the shading material, the shading material will be slightly concave due to the surface tension of the edges of microstructures 11a. Moreover, in the embodiment, adjusting the amount of the shading material or the speed of spin coating results in that only the microstructures 11a are filled with the shading material. In other words, the shading layer 12 and the microstructures 11*a* directly form a patterned shading layer.

Further, if spin coating is utilized, the speed of spin coating will be adjusted depending on fluidity of the shading material, surface roughness of the flexible substrate 11, and the distribution or the structure of the microstructures.

In addition, the design of the shape and the depth of the microstructure 11*a* will be adjusted depending on transmittance of the shading material itself The shading material is a carbon black photoresist for example. The optical density (O.D.) of a carbon black photoresist to ultraviolet is about 3/μm. Namely, ultraviolet transmittance of the carbon black photoresist having the thickness of 1 μm is about 0.001. In other words, the depth of the microstructure 11*a* (the thickness of a carbon black photoresist layer) may affect ultraviolet transmittance. The shallow microstructure 11*a* has relatively high light transmittance, and the deep microstructures 11*a* has relatively low light transmittance.

Although the microstructure 11*a* of the embodiment is designed to be a rectangular aspect, it may also have other aspects such as a trapezoid, wedge, and pyramid shape appearance, so that the thickness of the shading material with which the microstructures 11*a* are filled is not uniform. Therefore, the shading layer having various light transmittance is formed.

According to above steps, in one experimental example of the embodiment, the photomask is formed by the control conditions below. Firstly, 15W oxygen plasma passes through the substrate to increase hydrophilicity of the surface of the substrate. Then, the substrate is coated with the shading material by spin coating at a speed of 4000 rpm, and the shading material is carbon black photoresist EK520 for example. Carbon black photoresist EK520 includes about 22.5 wt % carbon black particles. Then, carbon black photoresist EK520 is baked at the temperature of 70° C. for 2 minutes to form the structure of the photomask shown in FIG. 2D.

Figure 2G:
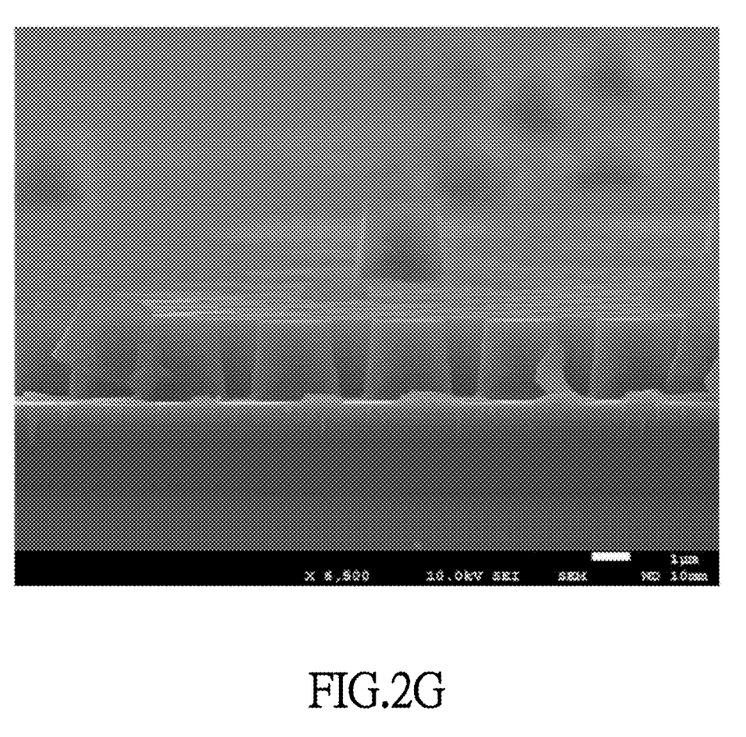
FIG. 2G shows a structure of a semiconductor wafer formed by a photomask according to the embodiment of the invention.

Next, FIG. 2E is a schematic diagram of applying the above photomask structure to the manufacturing process of semiconductors. The photomask of the embodiment is attached to and covers the photoresist layer 21 of the semiconductor substrate 20. Then, the photomask is removed after exposure and development so as to form the semiconductor structure shown in FIGS. 2F and 2G.

Figure 3:
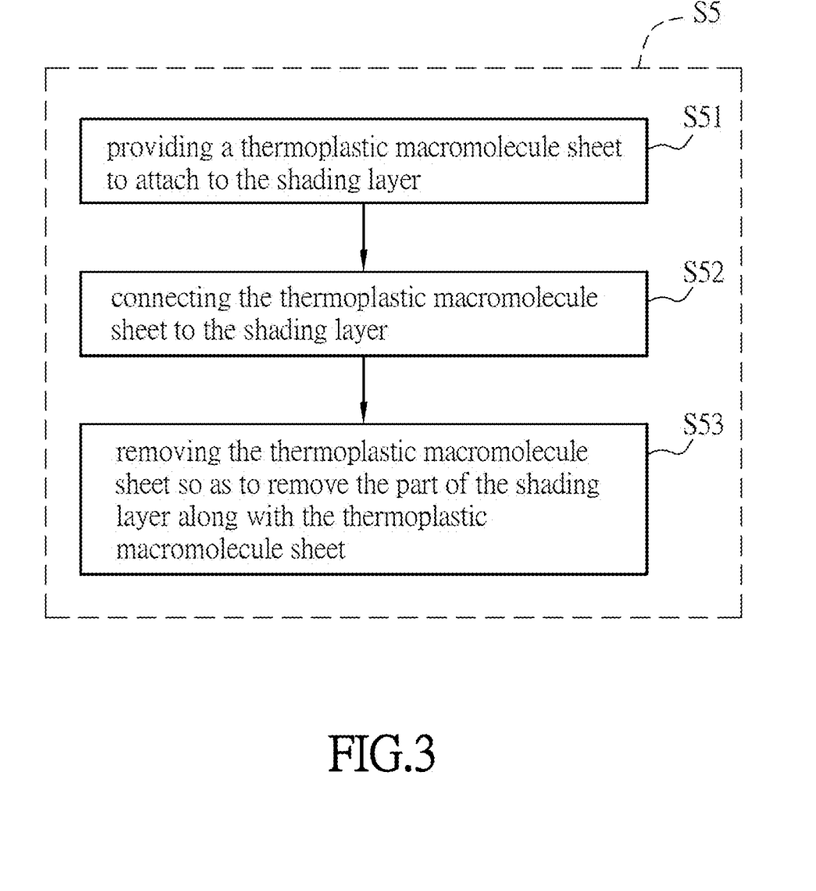
FIG. 3 is a detailed flow chart of step S5 of the manufacturing steps in FIG. 1.
Figure 4A:
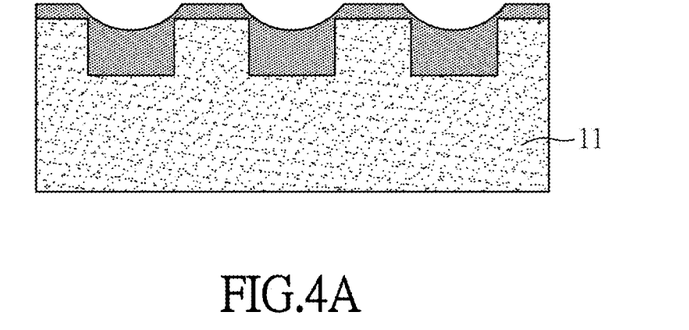
FIGS. 4A to 4C are additional schematic diagrams of manufacturing a photomask according to the embodiment of the invention.
Figure 4B:
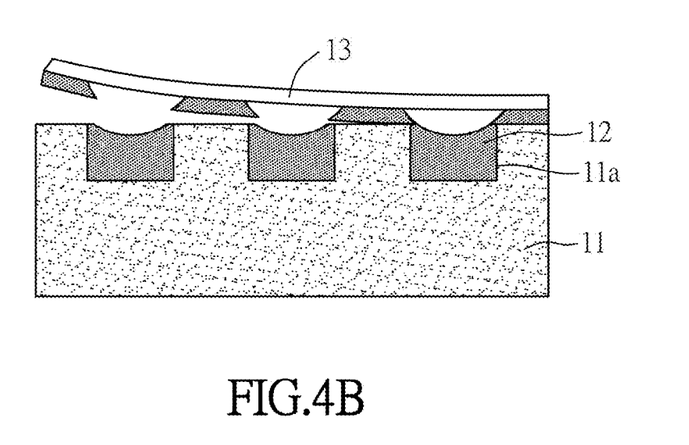
Figure 4C:
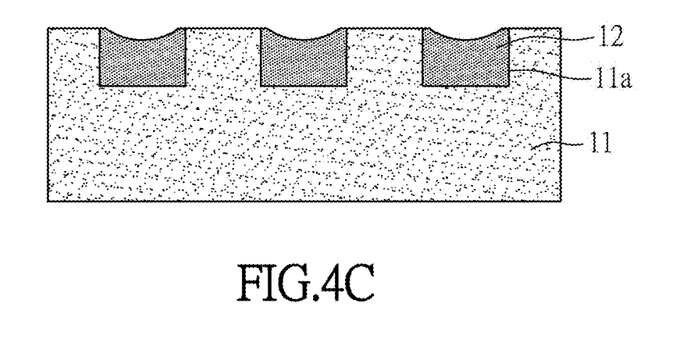

Referring to FIG. 1 and FIGS. 3 to 4C, FIG. 3 is a detailed flow chart of step S5 of the manufacturing steps in FIG. 1. FIGS. 4A to 4C are additional schematic diagrams of manufacturing a photomask according to the embodiment of the invention.

The manufacturing process of the photomask of the embodiment further includes a step of "after the shading layer 12 is solidified, a part of the shading layer 12 is removed to form a patterned shading layer (step S5)". Namely, in addition to the method that the shading layer 12 and the microstructures 11*a* directly form a patterned shading layer, a removing step may be additionally added to form a similar structure of the shading layer 12.

The substrate 11 is coated with the shading material by spin coating to form the shading layer 12 on the flexible substrate 11 (step S3) as shown in FIG. 4A. That is to say, not only the microstructures 11*a* are filled with the shading material, but also the surface of the flexible substrate 11 between the microstructures 11*a* is coated with it. At this time, it is necessary to remove a part of the shading layer to form the patterned shading layer (step S5).

In detail, step S5 further includes providing a thermoplastic macromolecule sheet 13 to attach to the shading layer (step S51). The thermoplastic macromolecule sheet 13 may be a flexible mold material and formed by, for example, polyethylene terephthalate (PET), rigid polyvinyl chloride (Rigid PVC), polyvinyl alcohol (PVA), polyamide (PA), polylactic acid (PLA), or other suitable mold materials having a characteristic of adhesion. Here, polyethylene terephthalate (PET) acts as the thermoplastic macromolecule sheet 13 for example. The reason why polyethylene terephthalate (PET) is used is that it has relatively low glass transition temperature (about 70° C.) and preferable surface adhesion. However, it is not limited to using polyethylene terephthalate (PET).

Next, the thermoplastic macromolecule sheet 13 is connected to the shading layer 12 (step S52). Suitable pressure and temperature are provided, for example an operating condition of one experimental example of the embodiment is to provide a pressure of 0.2 MPa and a temperature of 80° C. for the thermoplastic macromolecule sheet 13 with the thickness of 177 μm for one minute, to allow the surface of the thermoplastic macromolecule sheet 13 melting and being bonded to the shading layer 12 with which the substrate 11 is coated.

Then, the thermoplastic macromolecule sheet 13 is removed so as to remove the part of the shading layer 12 along with the thermoplastic macromolecule sheet (step S53). Thereby, the shading layer 12 coated on the surface of the flexible substrate 11 can be removed, so that only the microstructures 11*a* are filled with the shading material.

Figure 5A:
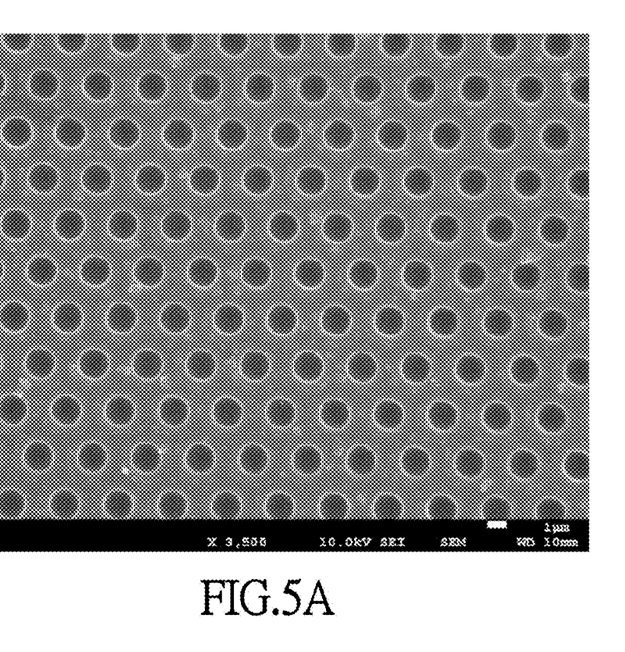
FIGS. 5A to 5B are an observation image and an enlarged image of a photomask which has a structure of round holes and is coated with a carbon black photoresist by spin coating in a process of manufacturing a photomask according to the embodiment of the invention.
Figure 5B:
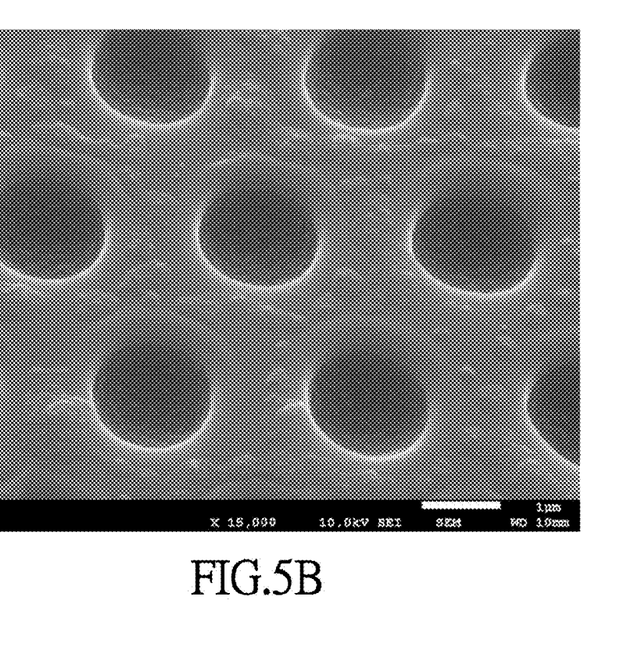
Figure 6A:
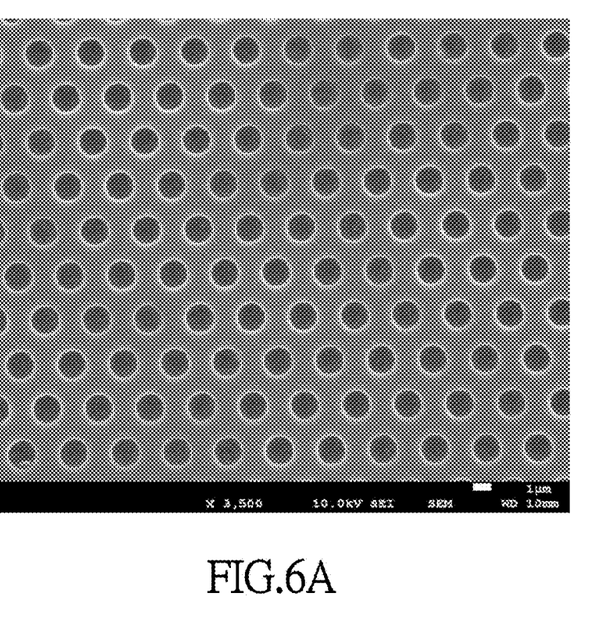
FIGS. 6A to 6B are an observation image and an enlarged image of the photomask in FIGS. 5A to 5B after removing a part of carbon black photoresist.
Figure 6B:
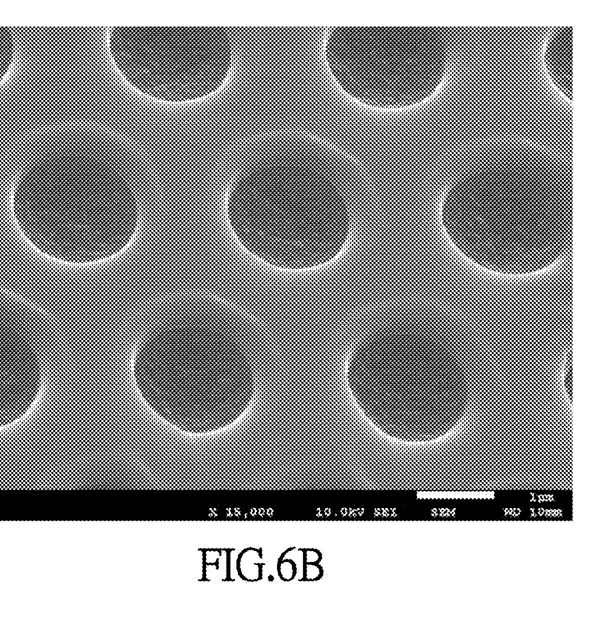

Referring to FIGS. 5A to 6B, FIGS. 5A to 5B are an observation image and an enlarged image of a photomask which has a structure of round holes and is coated with a carbon black photoresist by spin coating in a process of manufacturing a photomask according to the embodiment of the invention. FIGS. 6A to 6B are an observation image and an enlarged image of the photomask in FIGS. 5A to 5B after removing a part of carbon black photoresist.

As shown in FIG. 5A, when the flexible substrate is coated with the carbon black photoresist by spin coating, the microstructures will be filled with the carbon black photoresist, and the carbon black photoresist will be slightly concave due to the surface tension of the edges of microstructures 11*a*. FIGS. 6A to 6B are observation images of the photomask after removing a part of carbon black photoresist by thermoplastic macromolecule sheet. Most of the shading layer coated on the surface of the flexible substrate will be removed, so that only the microstructures are filled with the shading material to form the photomask.

In summary, a plurality of microstructures are formed on the flexible substrate and the shading material is formed on the substrate by coating. In such method, the cost is reduced, the manufacturing process is faster, the operating temperature is lower, and the manufacture becomes easier in comparison with the conventional method utilizing a metal layer as a shading material. Besides, because the shading material is a solution, the layer uniformity of the shading layer is improved. Moreover, utilizing the flexible substrate further results in that the tightness between the photomask and the semiconductor substrate becomes higher and the precision of exposure and development is improved.

Although the present invention has been described with reference to specific embodiments, this description is not meant to be construed in a limiting sense. Various modifications of the disclosed embodiments, as well as alternative embodiments, will be apparent to persons skilled in the art.

It is, therefore, contemplated that the appended claims will cover all modifications that fall within the true scope of the present invention.

What is claimed is:

1. A method for manufacturing a photomask, comprising:
    providing a flexible substrate;
    forming a plurality of microstructures on the flexible substrate;
    coating the flexible substrate with a shading material to form a shading layer on the substrate; and
    solidifying the shading layer;
    wherein the shading layer is a single layer.

2. The method of claim 1, wherein the material of the flexible substrate is polyurethane acrylate, polyvinyl alcohol, an ultraviolet curing resin, polydimethylsiloxane, or combinations thereof.

3. The method of claim 1, wherein the material of the shading layer is a carbon black photoresist, a red photoresist, or a green photoresist.

4. The method of claim 1, wherein the shading layer and the microstructures directly form a patterned shading layer.

5. The method of claim 1, wherein after the shading layer is solidified, a part of the shading layer is removed to form a patterned shading layer.

6. The method of claim 5, wherein the removing step further comprises:
    providing a thermoplastic macromolecule sheet to attach to the shading layer;
    connecting the thermoplastic macromolecule sheet to the shading layer; and
    removing the thermoplastic macromolecule sheet so as to remove the part of the shading layer along with the thermoplastic macromolecule sheet.

7. The method of claim 6, wherein the thermoplastic macromolecule sheet is formed by polyethylene terephthalate, rigid polyvinyl chloride, polyvinyl alcohol, polyamide, or polylactic acid.

8. The method of claim 1, wherein the shading material is formed on the substrate by spin coating, spray coating, blade coating, or immersion coating.

9. A photomask, comprising:
    a flexible substrate, having a plurality of microstructures on the surface thereof; and
    a shading layer, as a single layer, wherein the microstructures are filled with the shading layer, and the shading layer and the microstructures form a patterned shading layer.

10. The photomask of claim 9, wherein the material of the patterned shading layer is a carbon black photoresist, a red photoresist, or a green photoresist.

11. The photomask of claim 9, wherein the shading layer is disposed on the surface of the substrate between the microstructures simultaneously.

12. The photomask of claim 10, wherein the shading layer is disposed on the surface of the substrate between the microstructures simultaneously.

* * * * *